US010288506B2

(12) United States Patent
Pattok et al.

(10) Patent No.: US 10,288,506 B2
(45) Date of Patent: May 14, 2019

(54) INTEGRATED TORQUE SENSOR IN CONTROLLER BOARD AND EPS SYSTEM INCORPORATING THE SAME (71) Applicant: Steering Solutions IP Holding Corporation, Saginaw, MI (US)

(72) Inventors: Eric D. Pattok, Frankenmuth, MI (US); Travis L. Palmer, Frankenmuth, MI (US)

(73) Assignee: STEERING SOLUTIONS IP HOLDING CORPORATION, Saginaw, MI (US)

(*) Notice: Subject to any disclaimer, the term of this patent is extended or adjusted under 35 U.S.C. 154(b) by 0 days.

(21) Appl. No.: 15/786,985

(22) Filed: Oct. 18, 2017

(65) Prior Publication Data
US 2018/0106693 A1  Apr. 19, 2018

Related U.S. Application Data (60) Provisional application No. 62/410,276, filed on Oct. 19, 2016.

(51) Int. Cl.
*G01L 3/10* (2006.01)
*G01L 5/22* (2006.01)
(Continued)

(52) U.S. Cl.
CPC ............ *G01L 5/221* (2013.01); *B62D 5/0406* (2013.01); *B62D 5/0415* (2013.01);
(Continued)

(58) Field of Classification Search
CPC ....... G01L 25/003; G01L 5/221; G01L 3/104; G01L 1/127; G01L 3/105; G01N 27/72;
(Continued)

(56) References Cited

U.S. PATENT DOCUMENTS 6,211,631 B1 * 4/2001 Wilson-Jones ...... B62D 5/0406
180/444
6,695,091 B2 * 2/2004 Achenbach .......... B62D 5/0406
180/444
(Continued)

FOREIGN PATENT DOCUMENTS

DE    69712595 T2    8/2002
DE    10238318 B4    6/2011
(Continued)

OTHER PUBLICATIONS

Official Communication from the German Patent and Trademark Office for related DE Application No. 102017124284.8 dated Apr. 24, 2018; 10 pages; English Translation Included.

*Primary Examiner* — Jonathan M Dunlap
*Assistant Examiner* — Octavia Hollington
(74) *Attorney, Agent, or Firm* — Cantor Colburn LLP (57) ABSTRACT An electric power steering system includes a system housing, an electric motor, a steering shaft assembly, and an electronic control unit. The electric motor is disposed within a motor housing that is disposed within and is attached to the system housing. The steering shaft assembly has a torsion bar that extends at least partially through the system housing and motor housing. The electronic control unit a printed circuit board and a torque sensor. The printed circuit board is disposed within and is attached to the system housing. The torque sensor is disposed on the printed circuit board and is arranged to provide a signal indicative of angular displacement of the torsion bar.

17 Claims, 4 Drawing Sheets (51) Int. Cl.
  *G01L 25/00* (2006.01)
  *G01R 33/07* (2006.01)
  *H02K 7/00* (2006.01)
  *B62D 5/04* (2006.01)
  *H02K 1/22* (2006.01)

(52) U.S. Cl.
  CPC .......... *G01L 25/003* (2013.01); *G01R 33/072* (2013.01); *H02K 7/003* (2013.01); *B62D 5/0457* (2013.01); *G01L 3/104* (2013.01); *H02K 1/223* (2013.01)

(58) Field of Classification Search
  CPC .. B62D 5/0457; B62D 5/0406; B62D 5/0415; G01R 33/072; H02K 7/003; H02K 1/223
  USPC ..................................... 73/862.331–862.338

See application file for complete search history.

(56) References Cited

U.S. PATENT DOCUMENTS

| | | | |
|---|---|---|---|
| 7,174,795 B2 * | 2/2007 | Feng | G01D 5/145 73/862.331 |
| 7,188,533 B2 | 3/2007 | Pattok et al. | |
| 7,448,466 B2 * | 11/2008 | Miller | B62D 5/0406 180/444 |
| 7,677,114 B2 * | 3/2010 | Deshmukh | B62D 6/10 73/862.328 |
| 8,102,138 B2 * | 1/2012 | Sekine | B62D 5/0406 180/443 |
| 8,550,205 B2 * | 10/2013 | Kuroumaru | B62D 5/0406 180/443 |
| 8,627,918 B2 * | 1/2014 | Sekine | B62D 5/0406 180/444 |
| 8,910,742 B2 * | 12/2014 | Kikuta | B62D 5/0406 180/443 |
| 9,821,846 B2 * | 11/2017 | Schoepe | B62D 15/0215 |

FOREIGN PATENT DOCUMENTS

| | | |
|---|---|---|
| DE | 10336726 B4 | 1/2014 |
| WO | 2016043116 A1 | 3/2016 |

* cited by examiner

INTEGRATED TORQUE SENSOR IN CONTROLLER BOARD AND EPS SYSTEM INCORPORATING THE SAME

CROSS-REFERENCES TO RELATED APPLICATIONS

This patent application claims priority to U.S. Provisional Patent Application Ser. No. 62/410,276, filed Oct. 19, 2016 which is incorporated herein by reference in its entirety.

BACKGROUND

The present disclosure relates generally to a permanent magnet synchronous machine motor, and more particularly to a controller for a permanent magnet synchronous machine motor, and even more particularly to an integrated torque sensor and controller board for a controller of a permanent magnet synchronous machine motor.

Permanent Magnet Synchronous Machines (PMSM) motor systems are used in many applications, such as various electric power steering (EPS) system applications, where they are used to provide an assist torque to the steering system. In EPS applications, the PMSM motor systems includes a position sensor on a column shaft and may also include a torque sensor in proximity to the shaft to which the assist is being provided by the PMSM motor. The position and torque sensors may be incorporated into separate devices that are mounted to a printed circuit board. This typically requires multiple separate printed circuit boards.

Accordingly it is desirable to provide a more efficient and compact PMSM motor and controller.

SUMMARY

In at least one embodiment, an electric power steering system is provided. The electric power steering system includes a system housing, an electric motor, a first shaft, a second shaft, a rotor assembly, and an electronic control unit. The system housing defines a system housing bore along a steering column axis. The electric motor is disposed within a motor housing that is disposed within the system housing, the motor housing defining a motor housing cavity. The first shaft extends through the system housing bore and extends into the motor housing cavity along the steering column axis. The second shaft is operatively connected to the first shaft and extends through the motor housing cavity along the steering column axis. The rotor assembly is disposed about the first shaft and is received within the system housing bore. The electronic control unit is in communication with the electric motor and includes a printed circuit board and a torque sensor. The printed circuit board is disposed between an inner surface of the system housing and an outer surface of the motor housing. The torque sensor is disposed on the printed circuit board.

In addition to one or more of the features described herein, the printed circuit board is at least partially disposed about the rotor assembly.

In addition to one or more of the features described herein, a motor sense board is disposed on an end of the electric motor and is in communication with the electronic control unit.

In addition to one or more of the features described herein, the electronic control unit further comprising a control logic device disposed on the printed circuit board and in communication with the torque sensor.

In addition to one or more of the features described herein, a torsion bar disposed within and extending between the first shaft and the second shaft.

In addition to one or more of the features described herein, the torque sensor is arranged to provide a signal indicative of an angular displacement of the torsion bar to the control logic device responsive to rotation of the first shaft.

In addition to one or more of the features described herein, the rotor assembly includes a first rotor extending between a first rotor first end that is spaced apart from the first shaft and a first rotor second end.

In addition to one or more of the features described herein, the first rotor second end engages the second shaft.

In addition to one or more of the features described herein, the first rotor includes a first rotor first flange that is disposed at the first rotor first end.

In addition to one or more of the features described herein, the printed circuit board is disposed proximate the first rotor first flange.

In at least one embodiment, an electric power steering system is provided. The electric power steering system includes a system housing, an electric motor, a steering shaft assembly, and an electronic control unit. The electric motor is disposed within a motor housing that is disposed within and is attached to the system housing. The steering shaft assembly has a torsion bar that extends at least partially through the system housing and motor housing. The electronic control unit a printed circuit board and a torque sensor. The printed circuit board is disposed within and is attached to the system housing. The torque sensor is disposed on the printed circuit board and is arranged to provide a signal indicative of angular displacement of the torsion bar.

In addition to one or more of the features described herein, a motor sense board is disposed proximate an end of the motor housing and is spaced apart from the electronic control unit.

In addition to one or more of the features described herein, the motor sense board is arranged to provide a signal indicative of a rotary position of the electric motor to the electronic control unit.

In addition to one or more of the features described herein, the motor sense board is disposed on an end of the electric motor.

In addition to one or more of the features described herein, a rotor assembly is disposed within the system housing and has a first rotor that is disposed about a second rotor that engages the steering shaft assembly.

In addition to one or more of the features described herein, the first rotor includes a first sensor ring and a second sensor ring that is spaced apart from the first sensor ring.

In addition to one or more of the features described herein, a portion of the printed circuit board is disposed between the first sensor ring and the second sensor ring.

In addition to one or more of the features described herein, the printed circuit board defines a recess through which the rotor assembly extends.

In addition to one or more of the features described herein, the torque sensor includes a plurality of torque sensing elements that are disposed on opposite sides of the recess.

In addition to one or more of the features described herein, the electronic control unit further comprising a control logic device disposed on the printed circuit board and in communication with the torque sensor.

These and other advantages and features will become more apparent from the following description taken in conjunction with the drawings.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Figure 1:
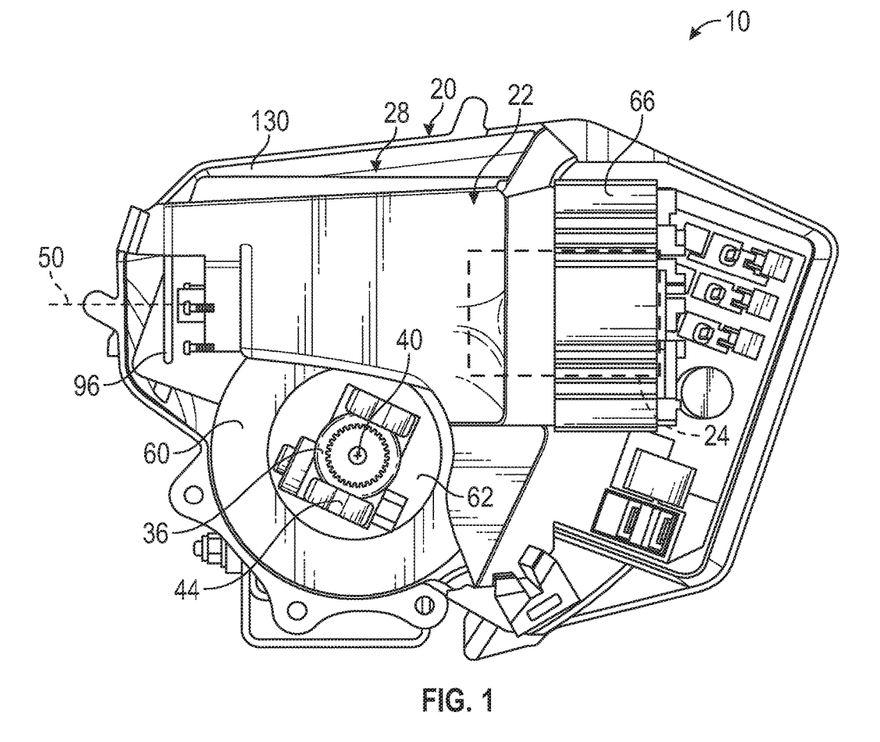
FIG. 1 is a side view of a portion of an electric power steering system.
Figure 2:
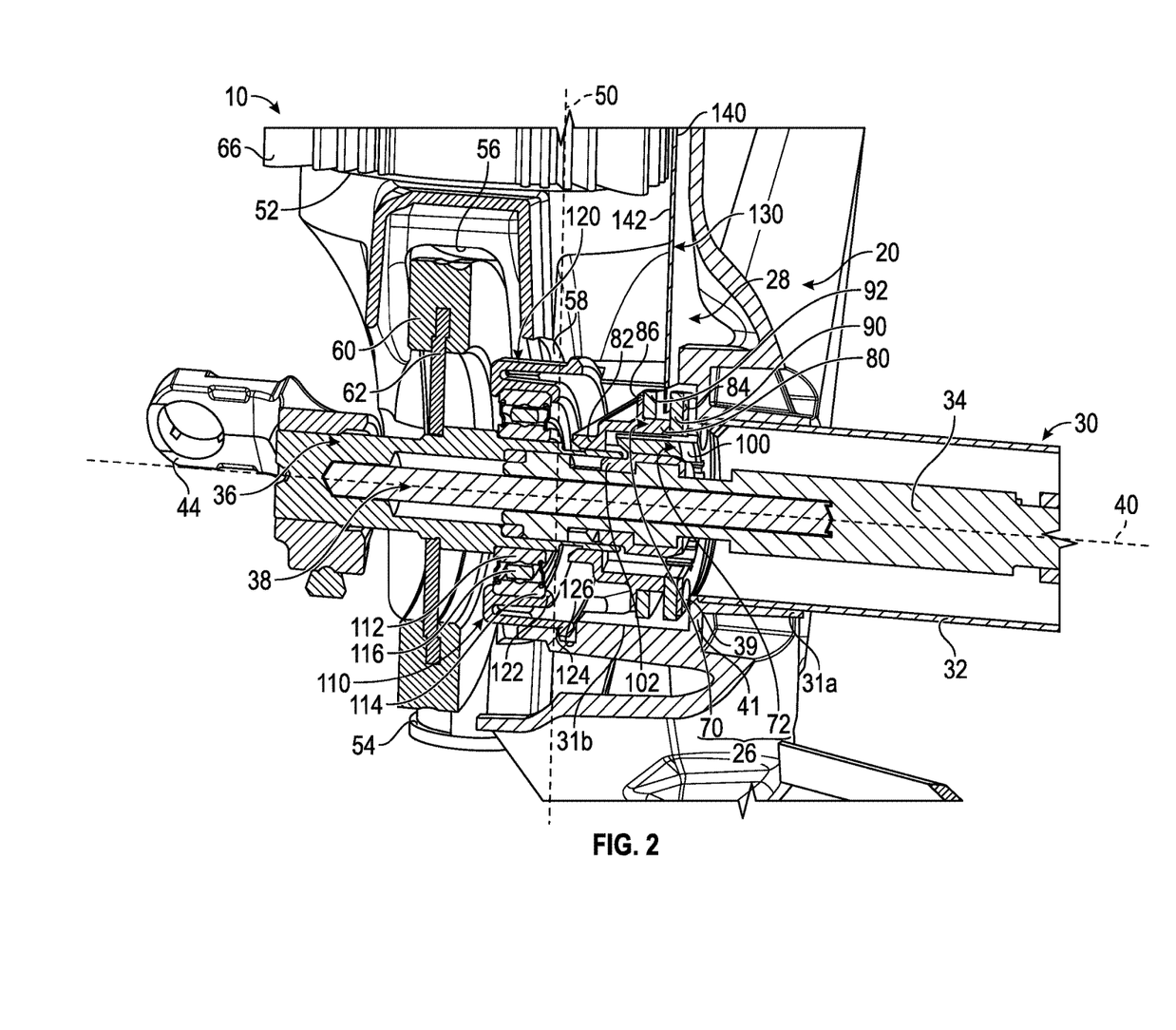
FIG. 2 is a perspective view of the electric power steering system.

Referring now to the Figures, where the present disclosure will be described with reference to specific embodiments, without limiting same. Referring to FIGS. 1 and 2, an electronic power steering system 10 may be configured for use as a column assist electronic power steering system (CEPS), a rack assist electronic power steering system (REPS) or other power steering assist system that is capable of providing a steering assist load or torque. The electronic power steering system 10 includes a system housing 20, a motor housing 22 disposed within the system housing 20, an electric motor 24, a rotor assembly 26, and an electronic control unit 28.

A steering column assembly 30 extends at least partially through the system housing 20 through a system housing first bore 31a and a system housing second bore 31b. The steering column assembly 30 includes a column jacket 32, a first shaft 34, a second shaft 36, and a torsion bar 38. The first shaft 34, the second shaft 36, and the torsion bar 38 may comprise a steering shaft assembly that extends along a steering column axis 40 through the column jacket 32.

The column jacket 32 is a hollow member through which at least one of the first shaft 34 and the second shaft 36 extends along the steering column axis 40. The column jacket 32 extends into the system housing bore 31 and is operatively connected to an inner surface of the system housing bore 31. In at least one embodiment, the column jacket 32 abuts a retaining flange 39 that is disposed proximate an end wall 41 of the system housing 20 and extends from the system housing first bore 31a towards the steering column axis 40.

The first shaft 34 extends through the column jacket 32 along the steering column axis 40 and is connected to a steering wheel. A driver steering input or input torque may be applied to the first shaft 34 via the steering wheel. The first shaft 34 defines a first cavity 42 that extends from a first end of the first shaft 34 towards the steering wheel.

The second shaft 36 is operatively connected to the first shaft 34 and extends through the system housing 20 towards a steering mechanism. The second shaft 36 extends through the motor housing 22 and is spaced apart from the column jacket 32. The second shaft 36 is operatively connected to at least a portion of the steering mechanism by a yoke 44 that is disposed at an end of the second shaft 36. The second shaft 36 defines a second cavity 46 that extends from an end of the second shaft 36 towards the yoke 44. At least a portion of the first shaft 34 is disposed within the second cavity 46.

The torsion bar 38 is disposed within and extends between the first shaft 34 and the second shaft 36 to facilitate a connection between the first shaft 34 and the second shaft 36. The torsion bar 38 is disposed within the first cavity 42 of the first shaft 34 and is disposed within the second cavity 46 of the second shaft 36. The first shaft 34 and the second shaft 36 are rotatable relative to each other about the steering column axis 40 through a predetermined angular rotation range and impart angular rotation to the torsion bar 38.

The motor housing 22 is disposed within the system housing 20 and is spaced apart from the column jacket 32. The motor housing 22 extends along a motor housing axis 50 that is disposed transverse to the steering column axis 40 between a first motor housing end 52 and a second motor housing end 54.

The motor housing 22 defines a first motor housing cavity 56 and a second motor housing cavity 58. The first motor housing cavity 56 extends from the second motor housing end 54 towards the first motor housing end 52 and is disposed about the steering column axis 40. The first motor housing cavity 56 is arranged to receive a worm gear 60 that is disposed about and is operatively connected to the second shaft 36 by a worm gear mounting plate 62. The worm gear mounting plate 62 is disposed within the worm gear 60 and is disposed about the second shaft 36. The second motor housing cavity 58 is disposed about the steering column axis 40 and is disposed coaxial with the system housing second bore 31b.

The electric motor 24 is at least partially disposed within the motor housing 22 and is drivably connected to the worm gear 60. Responsive to the driver input torque being applied to the first shaft 34 via the steering wheel, the worm gear 60 is driven by the electric motor 24 and applies an assist torque to the second shaft 36.

The electric motor 24 includes a heat sink 66 that is attached to and is configured to remove heat from the electric motor 24. The heat sink 66 is disposed on or proximate the first motor housing end 52.

The rotor assembly 26 extends through the system housing second bore 31b and the second motor housing cavity 58 and extends into the first motor housing cavity 56. The rotor assembly 26 includes a first rotor 70 that is disposed about a second rotor 72.

The first rotor 70 is disposed within and is spaced apart from the system housing second bore 31b. The first rotor 70 extends between a first rotor first end 80 that is disposed proximate the end wall 41 and a first rotor second end 82 that is disposed along the steering column axis 40. The first rotor first end 80 is spaced apart from and does not engage either of the first shaft 34 or the second shaft 36. The first rotor second end 82 engages and is operatively connected to the second shaft 36.

The first rotor 70 includes a first rotor first flange 84 that is disposed at the first rotor first end 80 and a first rotor second flange 86 that is disposed between the first rotor first flange 84 and the first rotor second end 82. The first rotor first flange 84 and the first rotor second flange 86 radially extend, relative to the steering column axis 40, towards the system housing second bore 31b. The first rotor first flange 84 is disposed proximate but is spaced apart from the end wall 41.

The first rotor 70 also includes a first sensor ring 90 and a second sensor ring 92 that are disposed about the first rotor 70. The first sensor ring 90 is disposed proximate and may abut the first rotor first flange 84. The second sensor ring 92 is spaced apart from the first sensor ring 90 and is disposed proximate and may abut the first rotor second flange 86, as shown in FIG. 2.

The second rotor 72 engages the first shaft 34. The second rotor 72 extends between a second rotor first end 100 that is disposed proximate the end wall 41 and a second rotor second end 102 that abuts a portion of the first rotor second end 82 such as the first rotor first flange 84. An end of the second shaft 36 extends into the second rotor second end 102.

A motor sense board 96 is disposed opposite the heat sink 66 and is disposed proximate the second motor housing end 54. The motor sense board 96 is spaced apart from the electronic control unit 28 and is disposed on an end of the electric motor 24. In at least one embodiment, the motor sense board 96 may be side mounted to the electric motor 24. The motor sense board 96 includes a motor position sensor that is arranged to provide a signal indicative of an angular or rotary position of a motor shaft of the electric motor 24 to the electronic control unit 28.

The steering shaft assembly is rotatably supported in the system housing 20 by a bearing assembly 110. The bearing assembly 110 is disposed about the second shaft 36 and is axially spaced apart from the rotor assembly 26, relative to the steering column axis 40. The bearing assembly 110 is axially disposed between the worm gear 60 and the rotor assembly 26. The bearing assembly 110 includes an inner bearing race 112 that is press fit to the second shaft 36, an outer bearing race 114 that is disposed about the inner bearing race 112, and at the least one rolling element 116 that is disposed between the inner bearing race 112 and the outer bearing race 114.

The bearing assembly 110 includes a bearing sleeve 120 that is radially disposed between the outer bearing race 114 and the second motor housing cavity 58 and/or the system housing second bore 31b. The bearing sleeve 120 is provided with first retaining features 122 such as shoulders that extend about ends of the outer bearing race 114. The bearing sleeve 120 is further provided with a second retaining feature 124 such as a tab that extends into a notch 126 that is defined by or within the system housing second bore 31b.

The electronic control unit 28 is configured as an integrated torque sensor and controller board that is arranged to monitor a torque applied to the first shaft 34 and power/control the electric motor 24. The electronic control unit 28 is disposed upstream (e.g. closer to the steering wheel) and is spaced apart from the electric motor 24. The electronic control unit 28 is configured to facilitate powering and controlling the electric motor 24 and monitoring torque that may be applied to at least one of the first shaft 34, the second shaft 36, and/or the torsion bar 38. The electronic control unit 28 includes a printed circuit board 130, torque sensing integrated circuit devices or torque sensor 132, and a plurality of electronic components 134.

The printed circuit board 130 is disposed within and attached to the system housing 20. The printed circuit board 130 is axially disposed between an inner surface of the system housing 20 and an outer surface of the motor housing 22. The printed circuit board 130 includes a first surface 140 and a second surface 142 that is disposed opposite the first surface 140. The first surface 140 faces towards the end wall 41 of the system housing 20 and the second surface 142 faces towards the motor housing 22. The first surface 140 and the second surface 142 each extend between a first printed circuit board end 144 and a second printed circuit board end 146 along an axis that is disposed substantially parallel to the motor housing axis 50. In at least one embodiment, the printed circuit board 130 includes an angled side 148 that extends from the first printed circuit board end 144 towards the second printed circuit board end 146. The angled side 148 is angled such that the angled side 148 becomes progressively closer to an opposing side of the printed circuit board 130 in a direction that extends from the second printed circuit board end 146 towards the first printed circuit board end 144.

At least a portion of the printed circuit board 130 proximate the first printed circuit board end 144 extends towards the first rotor 70 and is spaced apart from the first rotor 70. A portion of the printed circuit board 130 is disposed between the first rotor first flange 84 and the first rotor second flange 86. In other words, a portion of the printed circuit board 130 is disposed between the first sensor ring 90 and the second sensor ring 92. A portion of the printed circuit board 130 is disposed proximate the first rotor first flange 84 and the first sensor ring 90, such that the first sensor ring is disposed between the portion of the printed circuit board 130 and the first rotor first flange 84.

Figure 3:
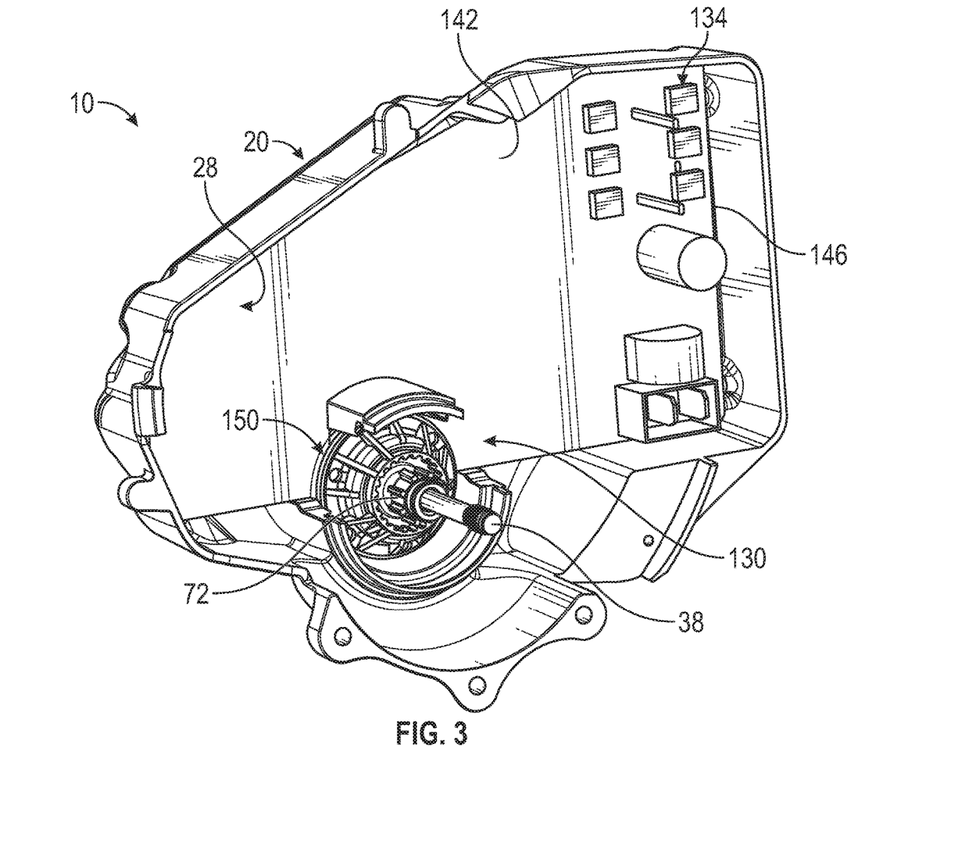
FIG. 3 is a first partial perspective view of an electronic control unit disposed within a system housing.

Referring to FIG. 3, the plurality electronic components 134 may extend from the first surface 140 through the second surface 142 of the printed circuit board 130. The plurality of electronic components 134 are disposed proximate the second printed circuit board end 146.

Figure 4:
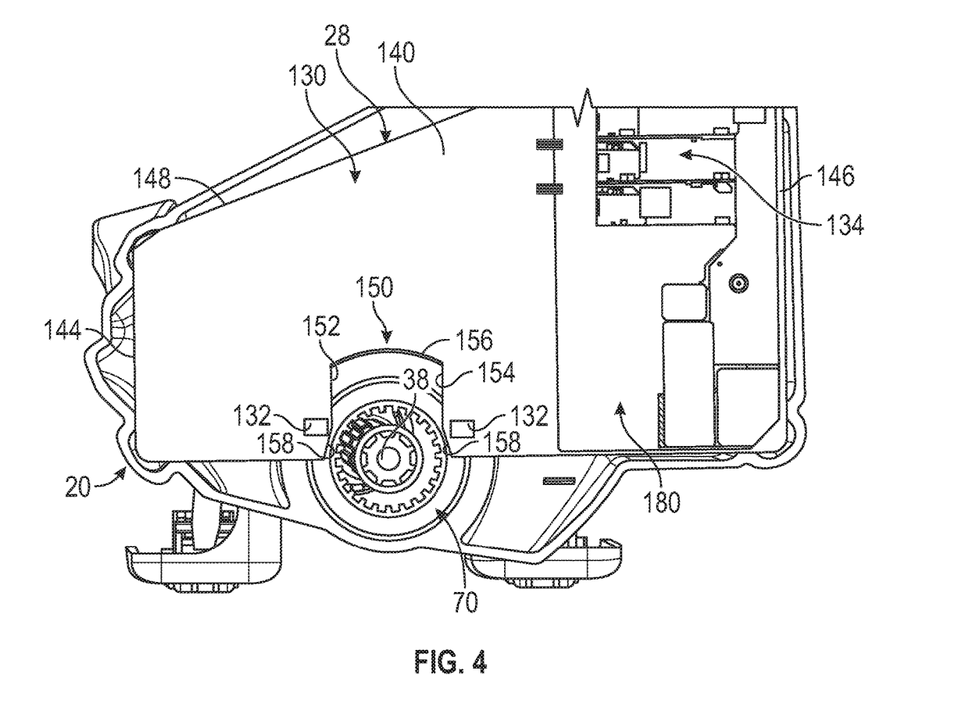
FIG. 4 is a second partial perspective view of the electronic control unit disposed within the system housing.
Figure 5:
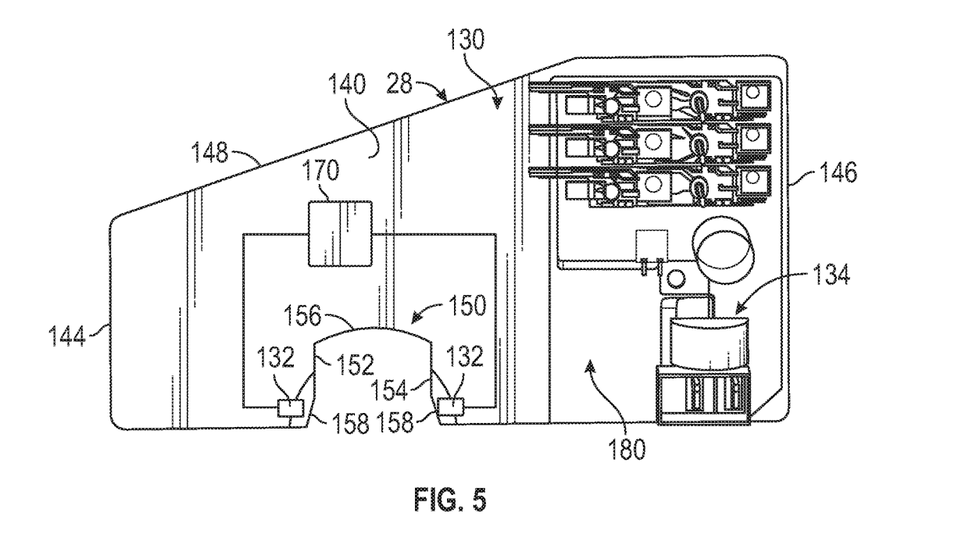
FIG. 5 is a plan view of the electronic control unit.

Referring to FIGS. 3-5, the printed circuit board 130 defines a recess 150 that is disposed between the first printed circuit board end 144 and the second printed circuit board end 146. The recess 150 extends from a first side of the printed circuit board 130 towards the angled side 148 of the printed circuit board 130. The recess 150 is sized such that the printed circuit board 130 is at least partially disposed about the first rotor 70 of the rotor assembly 26.

The rotor assembly 26, the first shaft 34, the second shaft 36, and/or the torsion bar 38 extend through the recess 150. The recess 150 includes a first side wall 152, a second side wall 154, and an arcuate end wall 156. The first side wall 152 is disposed opposite the second side wall 154 and each extends from a side of the printed circuit board 130 towards the arcuate end wall 156 that extends between the first side wall 152 and the second side wall 154, as shown in FIGS. 4 and 5. Ends of the first side wall 152 and the second side wall 154 that are disposed proximate the side of the printed circuit board 130 are provided with a chamfered portion 158. The chamfered portion 158 extends between the side of the printed circuit board 130 and substantially straight portions of the respective first and second side walls 152, 154.

Referring to FIGS. 4 and 5, the torque sensor 132 is disposed on the printed circuit board 130 and may extend through the printed circuit board 130. The torque sensor 132 may include a plurality of torque sensing elements that are disposed on opposite sides of the recess 150 such that a first torque sensing element is disposed proximate the first side wall 152 and a second torque sensing element is disposed proximate the second side wall 154. The torque sensor 132 is disposed between the first sensor ring 90 and the second sensor ring 92 and are completely spaced apart from the worm gear 60.

The torque sensor 132 may include Hall effect sensors that are configured to sense changes in magnetic flux associated with an angular displacement or rotation of the torsion bar 38 or the first shaft 34 that results from a steering input from a driver to the first shaft 34. A signal indicative of the sensed, detected, or measured angular displacement of the torsion bar 38 may be provided by the torque sensor 132 to at least one of the plurality of electronic components 134 and a control logic device 170 to provide a command signal to the electric motor 24 to apply an a motor assist torque via the worm gear 60 to the second shaft 36, responsive to rotation of at least one of the first shaft 34 or the torsion bar 38.

Referring to FIG. 5, the control logic device 170 is disposed on at least one of the first surface 140 or the second surface 142 of the printed circuit board 130 and is disposed proximate the arcuate end wall 156 of the recess 150. The control logic device 170 is in communication with the torque sensor 132. The control logic device 170 may be a control logic integrated circuit. The control logic device 170 and the torque sensor 132 is spaced apart from the plurality of electronic components 134.

The plurality of electronic components 134 may be disposed on a second printed circuit board 180 that is disposed on or is operatively connected to the second surface 142 of the printed circuit board 130 of the electronic control unit 28. The second printed circuit board 180 is disposed proximate the second printed circuit board end 146.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description.

Having thus described the present disclosure, it is claimed:

1. An electric power steering system, comprising:
   a system housing that defines a system housing bore that extends along a steering column axis;
   an electric motor is disposed within a motor housing that is disposed within the system housing, the motor housing defines a motor housing cavity;
   a first shaft extending through the system housing bore and extending into the motor housing cavity along the steering column axis;
   a second shaft is operatively connected to the first shaft and extends through the motor housing cavity along the steering column axis;
   a rotor assembly is disposed about the first shaft and is received within the system housing bore; and
   an electronic control unit in communication with the electric motor, comprising:
      a printed circuit board that is disposed between an inner surface of the system housing and an outer surface of the motor housing, the printed circuit board defines a recess through which the rotor assembly extends, and
      a torque sensor that is disposed on the printed circuit board, the torque sensor including a plurality of torque sensing elements that are disposed on opposite sides of the recess.

2. The electric power steering system of claim 1, wherein the printed circuit board is at least partially disposed about the rotor assembly.

3. The electric power steering system of claim 1, further comprising a motor sense board that is disposed on an end of the electric motor and is in communication with the electronic control unit.

4. The electric power steering system of claim 1, wherein the electronic control unit further comprising a control logic device that is disposed on the printed circuit board and is in communication with the torque sensor.

5. The electric power steering system of claim 4, further comprising:
   a torsion bar that is disposed within and extends between the first shaft and the second shaft.

6. The electric power steering system of claim 5, wherein the torque sensor is arranged to provide a signal indicative of an angular displacement of the torsion bar to the control logic device responsive to rotation of the first shaft.

7. The electric power steering system of claim 1, wherein the rotor assembly includes a first rotor that extends between a first rotor first end that is spaced apart from the first shaft and a first rotor second end.

8. The electric power steering system of claim 7, wherein the first rotor second end engages the second shaft.

9. The electric power steering system of claim 7, wherein the first rotor includes a first rotor first flange that is disposed at the first rotor first end.

10. The electric power steering system of claim 9, wherein the printed circuit board is disposed proximate the first rotor first flange.

11. An electric power steering system, comprising:
   a system housing;
   an electric motor disposed within a motor housing that is disposed within and is attached to the system housing;
   a steering shaft assembly having a torsion bar that extends at least partially through the system housing and motor housing;
   an electronic control unit, comprising:
      a printed circuit board disposed within and attached to the system housing, and
      a torque sensor disposed on the printed circuit board and arranged to provide a signal indicative of angular displacement of the torsion bar;
   a motor sense board that is disposed proximate an end of the motor housing and is spaced apart from the electronic control unit; and
   a rotor assembly that is disposed within the system housing and having a first rotor that is disposed about a second rotor that engages the steering shaft assembly, the first rotor includes a first sensor ring and a second sensor ring that is spaced apart from the first sensor ring.

12. The electric power steering system of claim 11, wherein a portion of the printed circuit board is disposed between the first sensor ring and the second sensor ring.

13. The electric power steering system of claim 11, wherein the printed circuit board defines a recess through which the rotor assembly extends.

14. The electric power steering system of claim 13, wherein the torque sensor includes a plurality of torque sensing elements that are disposed on opposite sides of the recess.

15. The electric power steering system of claim 13, wherein the electronic control unit further comprising a control logic device that is disposed on the printed circuit board and is in communication with the torque sensor.

16. The electric power steering system of claim 11, wherein the motor sense board is arranged to provide a signal indicative of a rotary position of the electric motor to the electronic control unit.

17. The electric power steering system of claim 11, wherein the motor sense board is disposed on an end of the electric motor.

\* \* \* \* \*